(12) United States Patent
Murata (10) Patent No.: US 7,962,047 B2
(45) Date of Patent: Jun. 14, 2011

(54) PREAMPLIFIER AND OPTICAL RECEIVING APPARATUS USING THE SAME

(75) Inventor: Tomoo Murata, Fussa (JP)

(73) Assignee: Hitachi, Ltd., Tokyo (JP)

( * ) Notice: Subject to any disclaimer, the term of this patent is extended or adjusted under 35 U.S.C. 154(b) by 710 days.

(21) Appl. No.: 11/960,689

(22) Filed: Dec. 19, 2007

(65) Prior Publication Data

US 2008/0205906 A1    Aug. 28, 2008

(30) Foreign Application Priority Data

Feb. 28, 2007    (JP) .................................. 2007-048333

(51) Int. Cl.
  *H04B 10/00*    (2006.01)
(52) U.S. Cl. ........................... 398/202; 398/208; 398/72
(58) Field of Classification Search ........... 398/202–214
  See application file for complete search history.

(56) References Cited

U.S. PATENT DOCUMENTS

| | | | |
|---|---|---|---|
| 6,246,282 B1 | 6/2001 | Oono et al. | |
| 6,337,887 B1 | 1/2002 | Oono | |
| 7,809,285 B2 | 10/2010 | Nishimura et al. | |
| 2006/0257153 A1* | 11/2006 | Furudate et al. | 398/202 |
| 2007/0071455 A1* | 3/2007 | Margalit et al. | 398/202 |
| 2007/0081827 A1* | 4/2007 | Ide et al. | 398/209 |
| 2008/0013962 A1* | 1/2008 | Nishikawa | 398/202 |
| 2008/0205906 A1* | 8/2008 | Murata | 398/208 |
| 2009/0252504 A1* | 10/2009 | Noda et al. | 398/202 |

FOREIGN PATENT DOCUMENTS

| | | |
|---|---|---|
| JP | 6-318908 A | 11/1994 |
| JP | 2004-180176 A | 6/2004 |
| JP | 2005-086466 A | 3/2005 |

* cited by examiner

*Primary Examiner* — Agustin Bello
(74) *Attorney, Agent, or Firm* — Miles & Stockbridge P.C.

(57) ABSTRACT

When an optical signal that is a wide dynamic range and different in level depending on burst signals is input as in a GPON system, a preamplifier can stably control the gain within a short preamble. The gain changeover of the preamplifier is controlled by the aid of timing information that is extracted from a data signal as data count number, to change over the gain at a high speed and with high precision. A level detector, a preamble recovery, a counter, and a control circuit are disposed within the preamplifier in addition to a TIA main body. In order to suppress the band deterioration or the phase margin reduction which are attributable to the gain changeover, there is provided a bias terminal for conducting a current injection and a current drawing with respect to the signal amplification transistor of the TIA main body.

10 Claims, 9 Drawing Sheets

| MONITOR LEVEL | SYMBOL | SUMMARY | CONTENTS |
|---|---|---|---|
| Level 1 | $V_{DET}$ | SIGNAL DETECTION MONITOR | MONITOR THRESHOLD VALUE FOR NECESSITY OR UNNECESSITY OF ACTIVATION OF DATA COUNT CIRCUIT |
| Level 2 | $V_{CH}$ | CHANGEOVER MONITOR | MONITOR THRESHOLD VALUE FOR NECESSITY OR UNNECESSITY OF CHANGEOVER OF TRANSIMPEDANCE |
| Level 3 | $V_{FRC}$ | RELIEF CHANGEOVER MONITOR | MONITOR THRESHOLD VALUE FOR NECESSITY OR UNNECESSITY OF CHANGEOVER OF EXCEPTIONAL TRANSIMPEDANCE AFTER CHANGEOVER LOCK |

PROVIDED FOR BAD NOISE ENVIRONMENT OF NO. 6/7 IN FIG. 12A

| NO. | TRANS-IMPEDANCE BEFORE TRANSITION | SIGNAL LEVEL | | | COUNT STATE | CHANGEOVER | AFTER TRANSITION | | REMARKS |
|---|---|---|---|---|---|---|---|---|---|
| | | Level 1 | Level 2 | Level 3 | | | TRANS-IMPEDANCE | CHANGEOVER LOCK | |
| 1 | HIGH | ↓ | ↓ | ↓ | – | NONE | HIGH | NONE | COUNT OPERATION STARTS WHEN INPUT > LEVEL 1 |
| 2 | HIGH | ↑ | ↓ | ↓ | 2 PULSES | NONE | HIGH | LOCK | SUPPRESS CHANGEOVER FROM HIGH TO MIDDLE WHEN COUNTS ARE 2 LEVELS OR HIGHER |
| 3 | HIGH | ↑ | ↑ | – | LOWER 2 PULSES | HIGH → MIDDLE | MIDDLE | – | |
| 4 | MIDDLE | – | ↓ | ↓ | THIRD PULSE | NONE | MIDDLE | LOCK | SUPPRESS CHANGEOVER FROM MIDDLE TO LOW WHEN COUNTS ARE 3 LEVELS OR HIGHER |
| 5 | MIDDLE | – | ↑ | – | THIRD PULSE | MIDDLE → LOW | LOW | LOCK | |
| 6 | HIGH | – | – | ↑ | 3 OR HIGHER BUT LOWER THAN 8 | HIGH → LOW | LOW | – | WHEN CHANGEOVER OF 3 TO 5 IS DISENABLED UNDER BAD NOISE ENVIRONMENT |
| 7 | MIDDLE | – | – | ↑ | 4 OR HIGHER BUT LOWER THAN 8 | MIDDLE → LOW | LOW | – | WHEN CHANGEOVER OF 5 IS DISABLED UNDER BAD NOISE ENVIRONMENT |

| GAIN CONTROL | FEEDBACK RESISTOR | FEATURE |||
|---|---|---|---|---|
| | | WITHSTAND EXTINCTION RATIO | CHANGEOVER SPEED | OTHERS |
| CLAMP TYPE |  | × | ○ (HIGH SPEED) | SIMPLE CIRCUIT |
| STEP CONTROL TYPE |  | ○ | △ (MIDDLE SPEED) | NARROW BAND |
| STEPLESS CONTROL TYPE |  | ○ | × (LOW SPEED) | NARROW BAND: ALMOST CONSTANT OUTPUT LEVEL THAT DOES NOT DEPEND ON PHOTOELECTRIC CURRENT |

PREAMPLIFIER AND OPTICAL RECEIVING APPARATUS USING THE SAME

CLAIM OF PRIORITY

The present application claims priority from Japanese application JP 2007-048333 filed on Feb. 28, 2007, the content of which is hereby incorporated by reference into this application.

FIELD OF THE INVENTION

The present invention relates to a preamplifier for a burst receiver of the PON (passive optical network) system, and an optical receiving apparatus using the preamplifier.

BACKGROUND OF THE INVENTION

The GEPON is the standard of a passive optical communication network PON that has been standardized as IEEE 802.3ah in the Electrical and Electric Society in U.S. As one structural example that realizes the above standard, up to now, there has been disclosed an optical receiving apparatus that controls the changeover of a transimpedance by using a level detector and a delayer as a changeover system that changes over the transimpedance of the preamplifier by means of a switch (for example, refer to JP-A No. 2005-86466).

Also, as one of the burst optical receivers that are the optical receivers which are applied to the optical communication network and transmit a signal beam in a burst form, up to now, there has been the following burst optical receiver. That is, the burst optical receiver includes a mask generator circuit that changes over an amplification gain according to the intensity of an electric signal that has been converted from a received signal beam, turns off a control signal when the rising and falling change points of the electric signal that has been subjected to amplification reach a given count value, and suppresses a process of generating an H level signal with respect to a first bit of the signal cell. There is disclosed a structure in which when N bits are required for changing over the gain of the burst preamplifier, the mask generator circuit sets a control signal to an on-state for an N-bit receiving time period before the gain changes over after a reset pulse signal has been input to the mask generator circuit (for example, refer to JP-A No. 2004-180176).

Also, as a receiver circuit in a burst multiplex transmission system, more particularly, a burst signal detector circuit that detects the arrival of the burst signal, up to now, there has been a technique by which after a counter circuit inputs the burst signals and completes the counting of a given number of pulses, an output signal from the counter circuit is changed to a high level to detect the burst signal (for example, refer to JP-A No. 06(1994)-318908).

SUMMARY OF THE INVENTION

Before achieving the present invention, the present inventors have started the study of a preamplifier that can be applied in the GPON system that is standardized by ITU-T G984.2 from the control type of the transimpedance.

Figure 2:
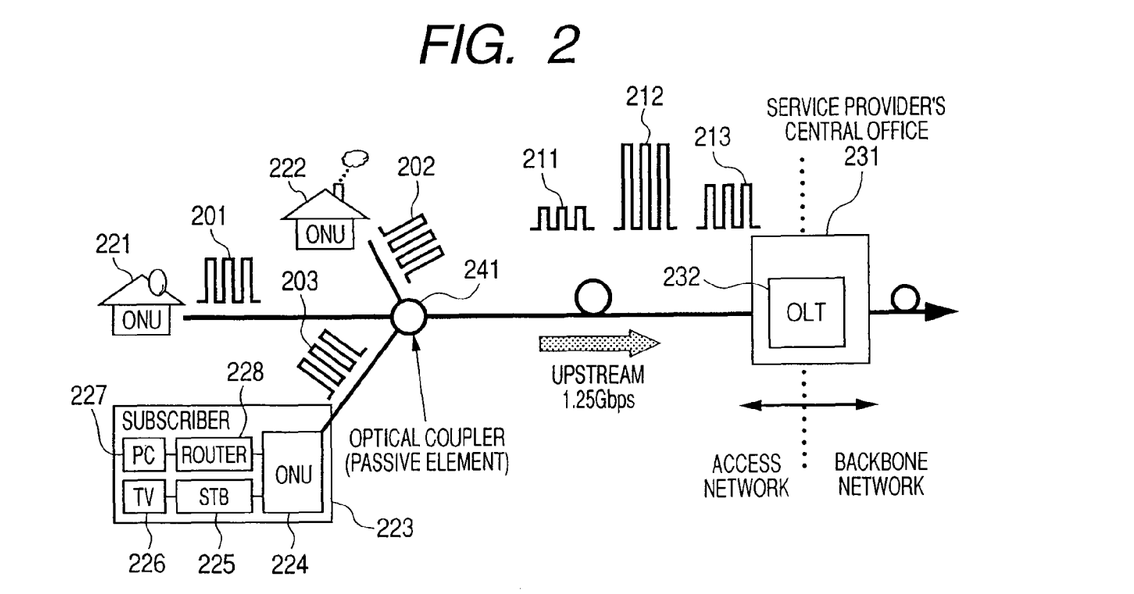
FIG. 2 is a schematic diagram showing a GPON system.

FIG. 2 is a schematic diagram of a GPON system. As shown in the figure, the GPON (gigabit-capable passive optical network) system connects plural ONU (optical network units) and one OLT (optical line terminal) to each other, and transmits or receives signals. In an example shown in the figure, a signal 201 that has been transmitted from an ONU 221, a signal 202 that has been transmitted from another ONU 222, and a signal 203 that has been transmitted from an ONU 224 that is connected directly or indirectly to a STB 225, a TV 226, a PC 227, and a router 228 in a subscriber 223 are transmitted to an OLT 232 that is disposed in a service provider's central office 231 through an optical coupler (passive element) 241 as signals 211, 212, and 213. The optical coupler 241 and the OLT 232 are connected to each other through a communication channel having an upload communication speed of, for example, 1.25 GHz. The service provider's central office 231 is also connected to a higher communication channel. In general, one side at which the optical coupler 241 exists is called "access system" whereas another side at which the higher communication channel exists is called "backbone system" with the service provider's central office 231 as a boundary. The OLT 232 is required to receive the burst optical signals 211, 212, and 213 that are different in level from each other which have been transmitted from the respective ONUs 211, 222, and 224.

Figure 3:
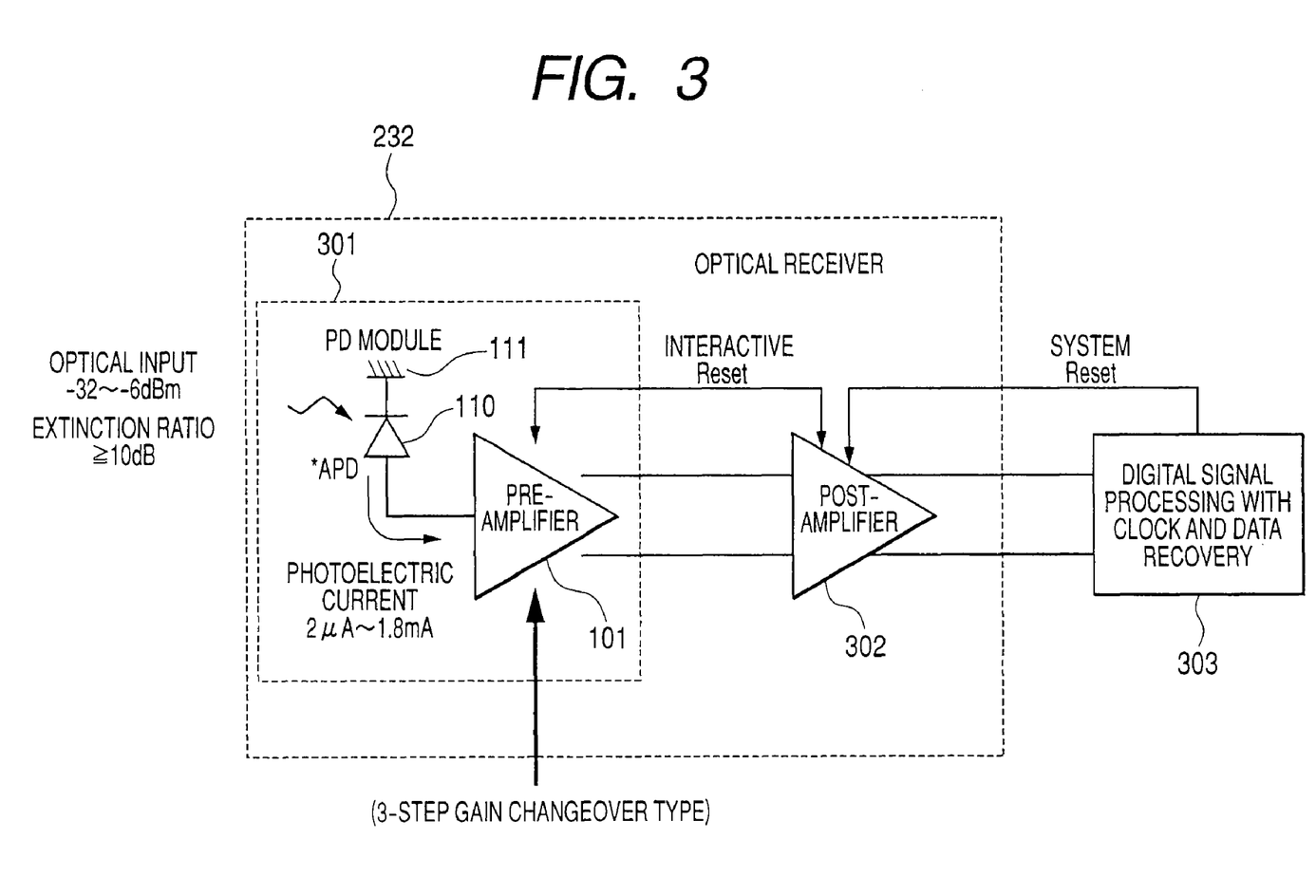
FIG. 3 is a schematic diagram showing an OLT side receiver module.

FIG. 3 is a structural diagram showing an optical receiver module 232. The optical receiver module 232 is made up of a PD module 302 that incorporates an APD (avalanche photo diode) 110 and a preamplifier 101 that is called "a TIA (transimpedance amplifier) circuit that conducts current to voltage conversion, and an ATC (auto threshold control)-IC (post amplifier) 302. The APD 110 has one terminal connected to a reference voltage (for example, ground potential) 111, and another terminal connected to an input port 112 of the preamplifier 101. In the PD module 301, 1) the optical signals that have been transmitted from the ONUs 221, 222, and 224 are subjected to photoelectric conversion by the APD 110, and extracted as current signals, and 2) the current signal is converted into a voltage signal by the preamplifier 101, and then transmitted to the post-stage ATC-IC 302. Then, the signal waveform is shaped by the ATC-IC 302, and the signal is transmitted to a signal processor circuit 303 having a CDR (clock and data recovery) function at a poststage. The optical signal that is input to the APD 110 can be, for example, −32 to −6 dBm in the optical input intensity, and 10 dB or more in the extinction ratio. However, the present invention is not limited to those numeric values. Also, the optical current that is output from the APD 110 can have a value, for example, ranging from 2 μA to 1.8 mA. However, the present invention is not limited to those numeric values. In this example, the preamplifier 101 is of a gain changeover type in which its gain can be changed by changeover, and the number of changeovers can be set to, for example, three. The output of the preamplifier 101 is connected to the input of the ATC-IC 302, and, for example, preferably differentially connected. However, the present invention is not limited to this configuration. Both of the preamplifier 101 and the ATC-IC 302 are controlled by a bidirectional Reset. The output of the ATC-IC 302 is connected to the input of a signal processor ASIC 303 with a CDR, and, for example, preferably differentially connected. However, the present invention is not limited to this configuration. The ATC-IC 302 is controlled according to a reset signal from the signal processor ASIC 303.

Figure 4:
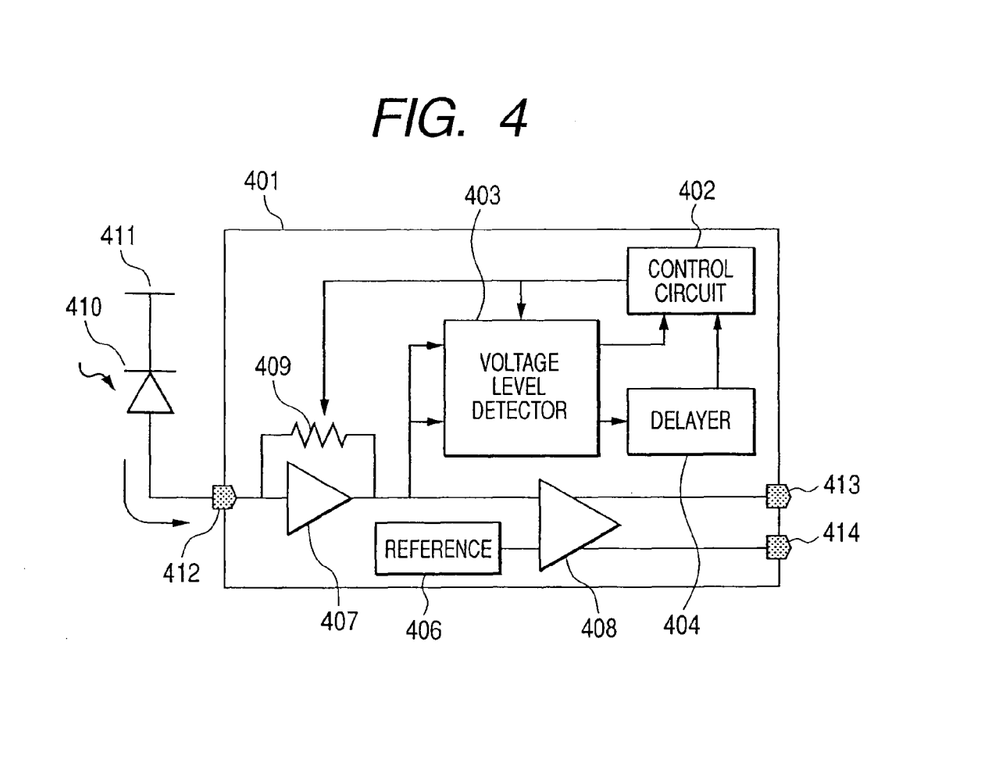
FIG. 4 is a block diagram showing an example of the preamplifier that satisfies the GEPON standard.

FIG. 4 is a structural diagram showing a preamplifier obtained by reconstituting the preamplifier disclosed in FIG. 3 of JP-A No. 2005-86466 from the inventors' unique viewpoint. The main function of the preamplifier 401 is to output the optical current signal that has been input to the PD 410 to a DOUTP/M as a voltage signal. The APD 410 has one terminal connected to a reference level (for example, ground potential) 411 and another terminal connected to an input port 412 of the preamplifier 401. A main TIA 407 subjects the optical current that has been input from the PD 410 through an input port 412 to current/voltage conversion. The output of the main TIA 407 is fed back to the input of the main TIA 407 through a feedback resistor 409. The conversion coefficient (gain) of the current/voltage conversion is called "transimpedance", and can be controlled in the level according to a control signal from the control circuit 402. A main path outputs the signal that has been converted into the voltage from the main amplifier 407 to output ports 413 and 414 through an output amplifier 408. The output amplifier 408 outputs a result obtained by comparing the output of the main amplifier (main TIA) 407 with the output of a reference level generator 406 to output ports 413 and 414. A voltage level detector 403 is connected to the output of the main TIA 407, and detects the level of an output signal from the main TIA 407. A signal corresponding to the signal level that has been detected by the voltage level detector 403 is input to a delayer 404. The signal is subjected to delay processing by the delayer 404, and thereafter output to the control circuit 402 as a timing control signal. The control circuit 402 outputs a control signal to the main TIA 407 on the basis of the output of the voltage level detector 403 and the timing control signal from the delayer 404, and controls the transimpedance of the main TIA 407.

Figure 7:
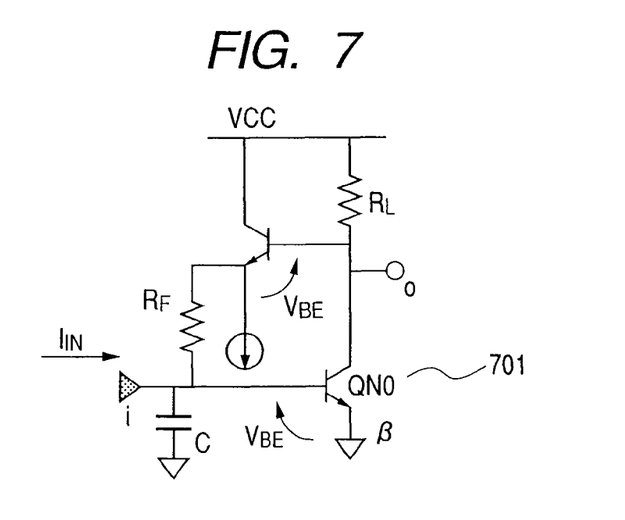
FIG. 7 is a schematic circuit diagram showing the TIA that is most simply configured.

FIG. 7 shows the simplest structural example of the TIA. Reference i denotes an input port, o is an output port, and QN0 is a main transistor 701. Also, reference $R_L$ denotes a load resistor, $R_F$ is a feedback resistor 409, and the respective resistances are represented by $R_L$ and $R_F$.

When a band (fc) of the circuit shown in the figure is represented by the following expression when it is assumed that an open loop gain is a.

$$f_c = \frac{1+a}{2\pi \cdot R_F C} \quad \text{Ex 1}$$

Also, the loop gain is represented by the following expression.

$$\frac{\beta \cdot R_L}{R_F} \quad \text{Ex 2}$$

For that reason, when a feedback resistance RF is larger, it is estimated that the band is narrower, and when a feedback resistance RF is smaller, it is estimated that the phase margin is lower. Also, in general, a factor for limiting the minimum input of the amplifier is a noise. For that reason, it is necessary to increase the feedback resistance $R_F$ in order to reduce the thermal noise that is the main noise component of the preamplifier 401. On the other hand, the maximum input is to saturate the operation of the transistor within the circuit, and it is necessary to reduce the feedback resistance $R_F$. Under the circumstance, in order to deal with the input of a wide dynamic range, plural gains are prepared, and the feedback resistance $R_F$ and the load resistance $R_L$ are controlled by the control circuit according to the optical reception level to select an appropriate gain.

Figure 14:
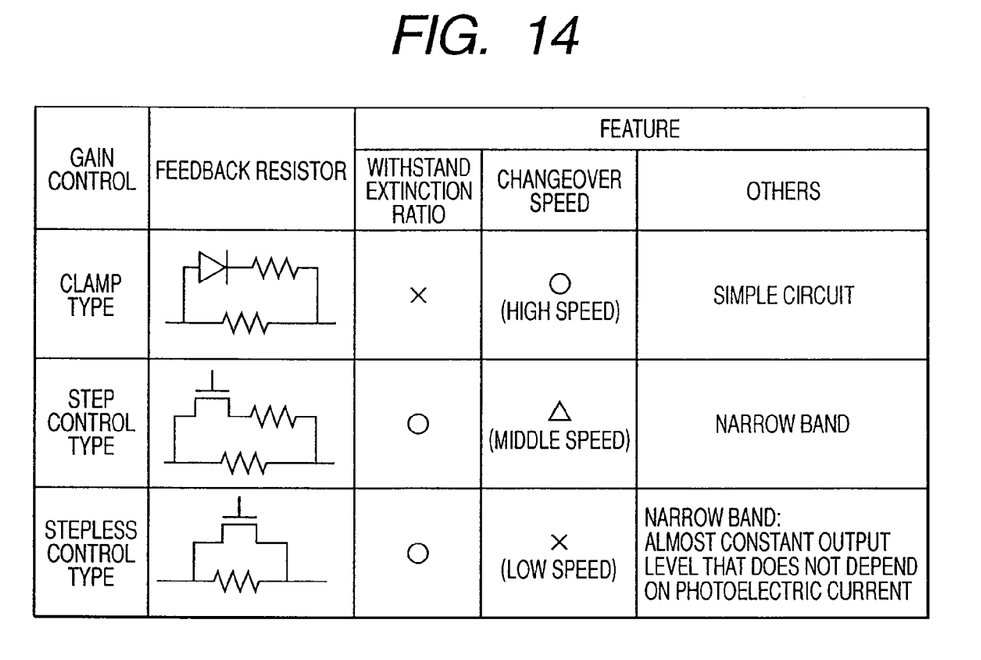
FIG. 14 is a diagram showing a control system of the transimpedance value.

FIG. 14 shows a changeover type of the transimpedance. The changeover types of the transimpedance include a cramp type, a step changeover type, and a nonstep changeover type. The cramp type cannot realize the extinction ratio resistance in principle, and the nonstep changeover type requires a sufficient time in order to achieve the stabilizing operation of the circuit. As a result, it is concluded that in order to ensure the extinction ratio resistance and achieve the stabilizing operation of the circuit, it is most effective to realize the changeover of the transimpedance by the aid of the step changeover type.

Under the above circumstances, it has been studied from the inventors' unique viewpoint whether the preamplifier configuration shown in FIG. 4 which is used in the GEPON standard realization can be applied, or not.

Figure 5:
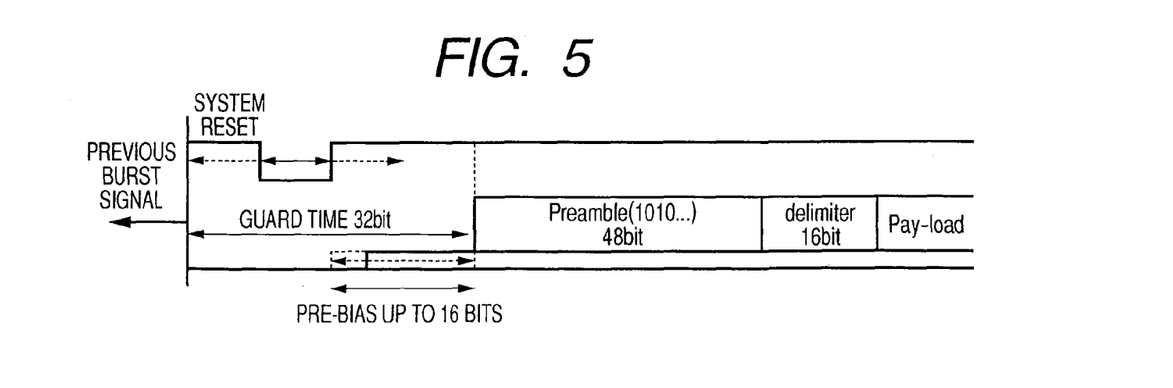
FIG. 5 is a diagram showing an example of one frame that is standardized by ITU-T G984.2.

FIG. 5 shows the data structure of the burst signal. One frame of the burst optical signal includes 1) a prebias section, 2) a preamble section, 3) a delimiter section, and 4) a payload section.

1) The prebias section is a section for stabilizing the optical output at the time of transmission, and 0 to 16 bits are allocated to the prebias section in the standard. What bit number among 0 to 16 bits are allocated vary depending on the environments. 2) The preamble section is a section for conducting clock synchronization, and 44 bits are allocated to the preamble section in the standard. 3) The delimiter section is a section for detecting the frame, and 20 bits are allocated to the delimiter section in the standard. 4) The payload section is allocated for data body.

Because the above data structure is applied, it is necessary to complete both of the output stabilization of TIA/ATC and clock synchronization at CDR in the preamble section.

Figure 6:
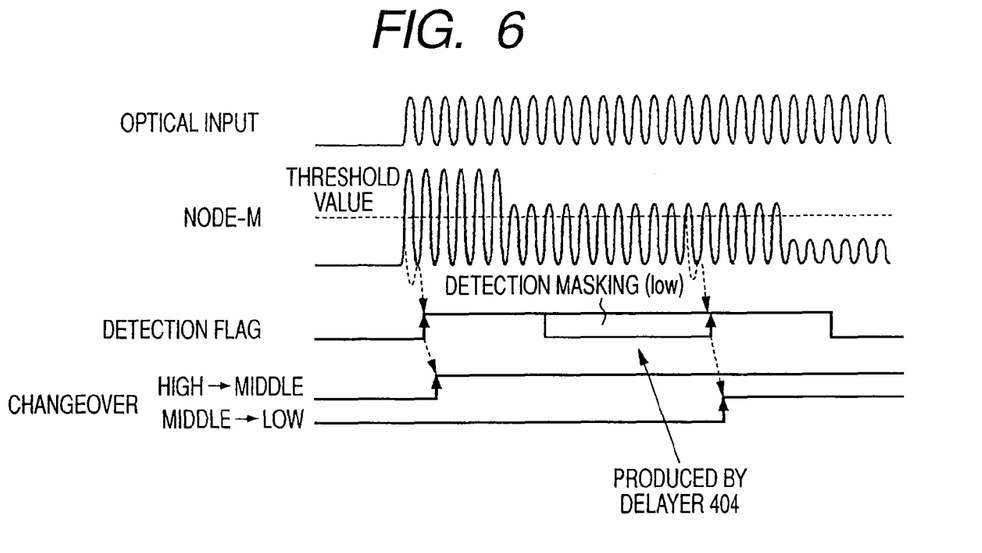
FIG. 6 is a diagram showing a transimpedance changeover image in the GEPON.

In the GEPON that applies the conventional system, the preamble section is 256 bits or more, and even if the device or the environmental conditions vary, the gain changeover of the TIA can be conducted on the basis of the timing control signal generated by the delayer 404, which originates with the input level determination as shown in FIG. 6, by the aid of a circuit shown in FIG. 4.

However, in the specification of 1.24 Gbps which is regulated in ITU-T G.984.2, 44 bits need to be distributed by TIA/ATC/CDR. It is necessary to complete that the output is stabilized, that is, the gain changeover is completed when TIA is within 16 bits from the data head even if estimation is largely made, and thereafter the gain changeover is not conducted.

For that reason, it is concluded that the system using the delayer 404 originating with the level detection is difficult to deal with the short overhead that is the feature of the GPON system.

Figure 8:
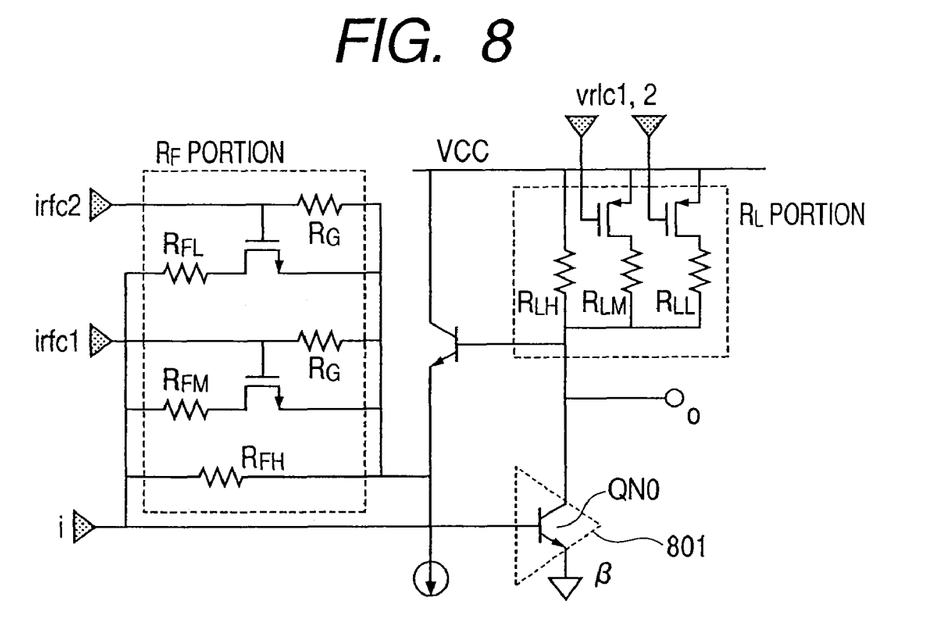
FIG. 8 is a circuit diagram showing an example of a conventional transimpedance amplifier corresponding to the changeover of a transimpedance.

FIG. 8 is a structural diagram showing a conventional TIA. The TIA is configured in such a manner that a load resistor $R_L$ portion and a feedback resistor $R_F$ portion are connected to an amplifier 801 including a main transistor QN0. When the gain control function is introduced, both of the lower band at the time of the high gain and the reduced phase margin at the time of the low gain must be suppressed. To achieve this, up to now, the TIA is so designed as to change over the negative resistance $R_L$ according to the feedback resistance $R_F$ as shown in FIG. 8, thereby achieving the above suppression.

However, it is also concluded that when a rising of the output load which is higher than the conventional output load with dealing with the short overhead is estimated with dealing with the short overhead, and a new countermeasure against the lower band and the reduced phase margin is required.

JP-A No. 2004-180176 discloses a technique by which the control signal is set to an on-state after a predetermined number of bits have been counted up. In this technique, it appears that data per se is not used for counting, but control is conducted from an external ASIC.

Also, JP-A No. 06(1994)-318908 discloses a technique by which a counter is used for detection of the burst signal. In this technique, the counting operation conducted by the counter is not used for changing over the gain of the transimpedance amplifier.

A representative example of the present invention is represented as follows. That is, the changeover control system of the present invention subjects a PD current to current/voltage conversion by a main TiA, converts a voltage signal into plural level detection signals and plural data detection signals, and changes over a transimpedance according to the signal level detection signal and the data detection signal state. Also, the plural level detection signals are determined on the basis of the extinction ratio and the assumed noise.

Also, the injection/drawing of a current into/from a main transistor within the main TiA is controlled for each of the transimpedances.

More specifically, according to the present invention, there is provided a preamplifier comprising an input port that inputs a current signal according to the intensity of an optical signal; a first amplifier that converts the current signal that is input from the input port into a voltage signal; a second amplifier that inputs the voltage signal that is output from the first amplifier and amplifies the voltage signal; an output port that outputs the voltage signal that is output from the second amplifier; and a counter that counts the number of voltage signals and outputs a counted result, wherein the gain of the first amplifier is changed over on the basis of the count value that is output from the counter.

The representative advantage of the present invention with the above configuration resides in that the transimpedance is appropriately changed over within the short overhead of the GPON system, to obtain a stable output waveform.

DETAILED DESCRIPTION OF THE PREFERRED EMBODIMENTS

Now, a description will be given in more detail of preferred embodiments of the present invention with reference to the accompanying drawings.

First Embodiment

Elements that constitute the respective blocks in a first embodiment are formed on one semiconductor substrate through a known integrated circuit technology. A transistor element is not limited to BJT, but can be realized by any elements.

Figure 1:
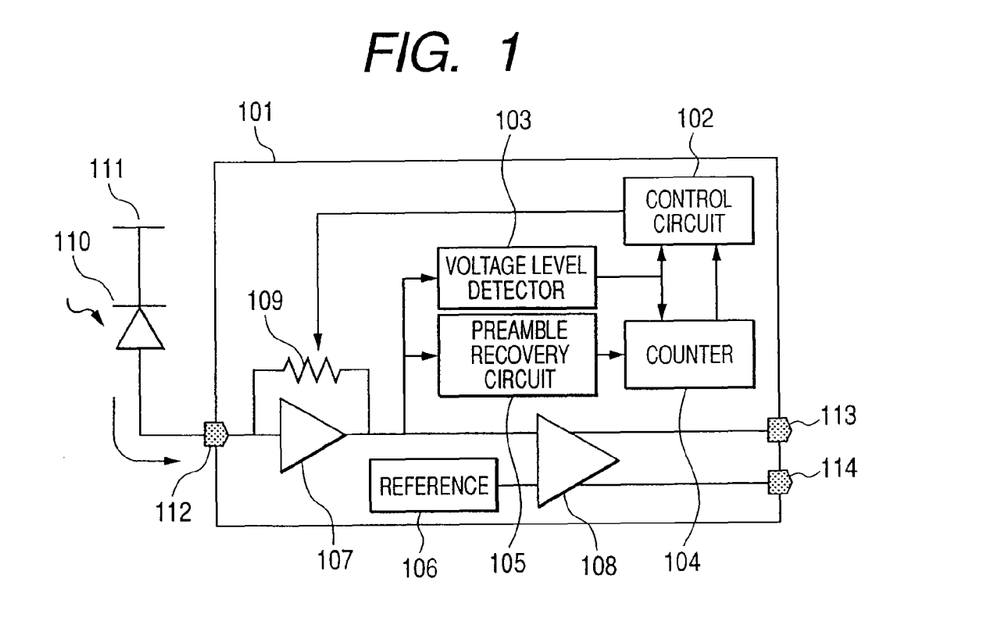
FIG. 1 is a block diagram showing a preamplifier according to the present invention.

FIG. 1 shows a preamplifier circuit according to this embodiment.

A main TIA 107 subjects an optical current that has been input from a PD 110 to current/voltage conversion. The output of the main TIA 107 is fed back to the input of the main TIA 107 through a feedback resistor 109. The conversion coefficient (gain) at the time of conducting the current/voltage conversion is called "transimpedance", and can be controlled in level according to a control signal from a control circuit 102. It is preferable that the number of gain steps is smaller from the viewpoint of increasing the changeover timing speed whereas the number of gain steps is larger from the dynamic range regulation of input and output. Taking the high speed changeover and the ease of the control into consideration, for example, the provision of three steps of high/middle/low is preferable. However, the present invention is not limited to the number of gain steps. Because an initial state corresponds to a fine input signal, the transimpedance is normally set to be high.

A main path is a path that outputs the signal that has been converted into the voltage to output ports 113 and 114 from the main amplifier 107 through an output amplifier 108. The output amplifier 108 compares the output of the main amplifier (main TIA) 107 with the output of a reference 106, and outputs the comparison result to the output ports 113 and 114.

Figure 10:
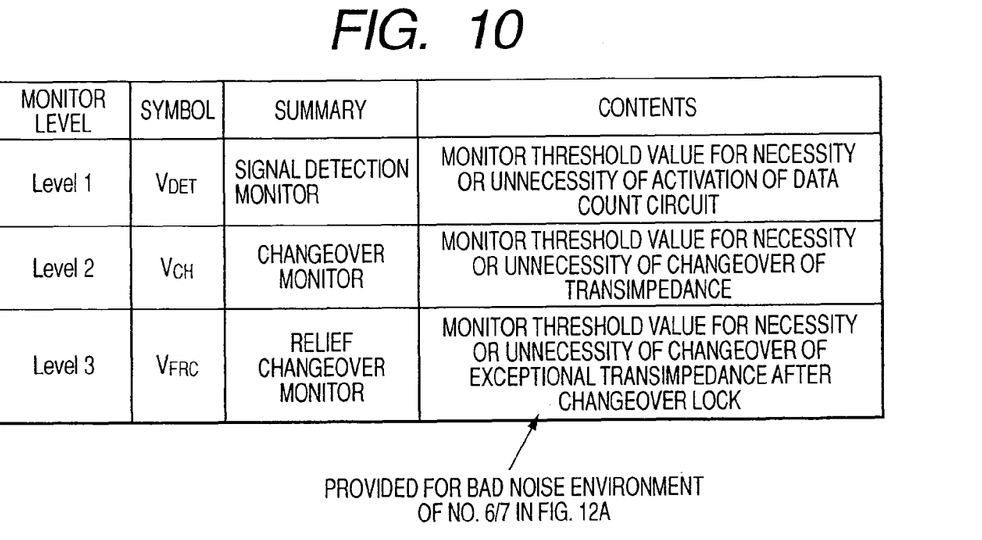
FIG. 10 is a diagram showing the contents of a comparison threshold level.
Figure 11:
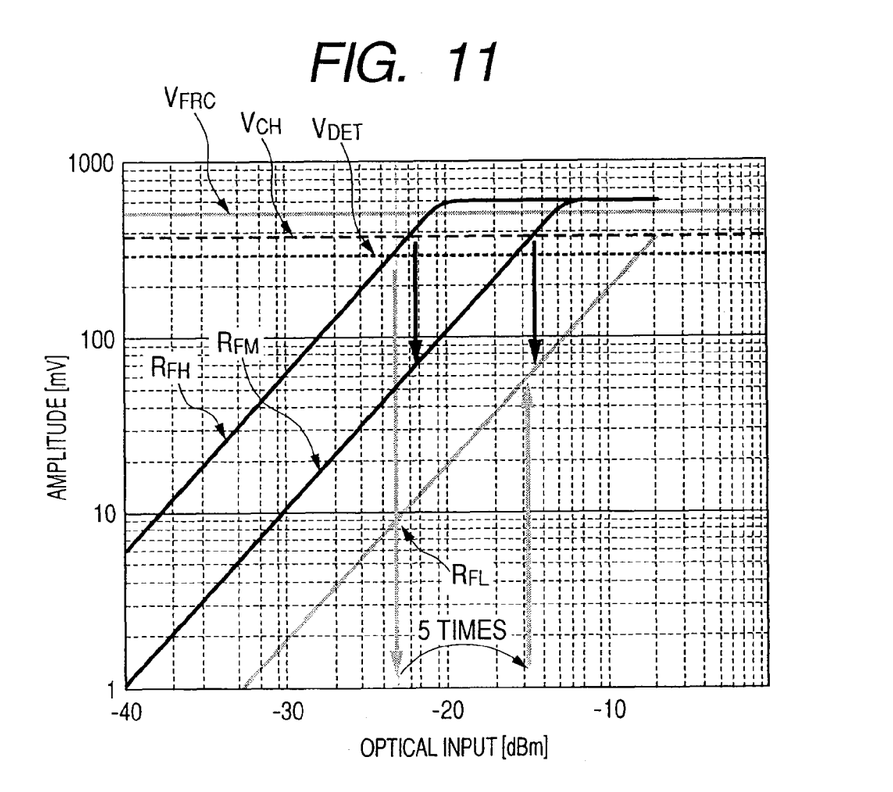
FIG. 11 is a diagram showing an example of a level diagram when the number of changeovers is three.

A voltage level detector 103 is connected to the output of the main TIA 107, and compares the signal that has been converted into the voltage by the main TIA 107 with three signal levels shown in FIG. 10. When the signal level that has been converted into the voltage is equal to or higher than a comparison threshold value 1 (i.e., Vdet as shown in FIG. 11 and LEVEL1 as shown in FIG. 10) (level 1: $V_{DET}$) by one degree or higher, a flag (counter enable) that transits the counter 104 to the operation enable state is output to the counter 104. When the signal level that has been converted into the voltage is equal to or higher than a comparison threshold value 2 (level 2: $V_{CH}$) of the voltage level detector 103, a flag that decreases the transimpedance by one step is output to the control circuit 102. When the signal level that has been converted into the voltage is equal to or higher than a comparison threshold value 3 (level 3: $V_{FRC}$) of the voltage level detector 103, a flag that decreases the transimpedance to the minimum value is output to the control circuit 102.

A preamble recovery 105 is connected to the output of the main TIA 107, converts the signal that has been converted into the voltage into a voltage that is logically meaningful in an internal circuit, and outputs the converted voltage to a poststage counter 104. It is preferable that the preamble recovery 105 is made up of, for example, a BPF (band pass filter).

The counter 104 is connected between a counter enable output of the voltage level detector 103 and the output of the preamble recovery 105, counts the number of signals that is 1 or higher in the comparison threshold value, and outputs its result to the control circuit 102 as timing information (timing control signal).

Figure 12A:
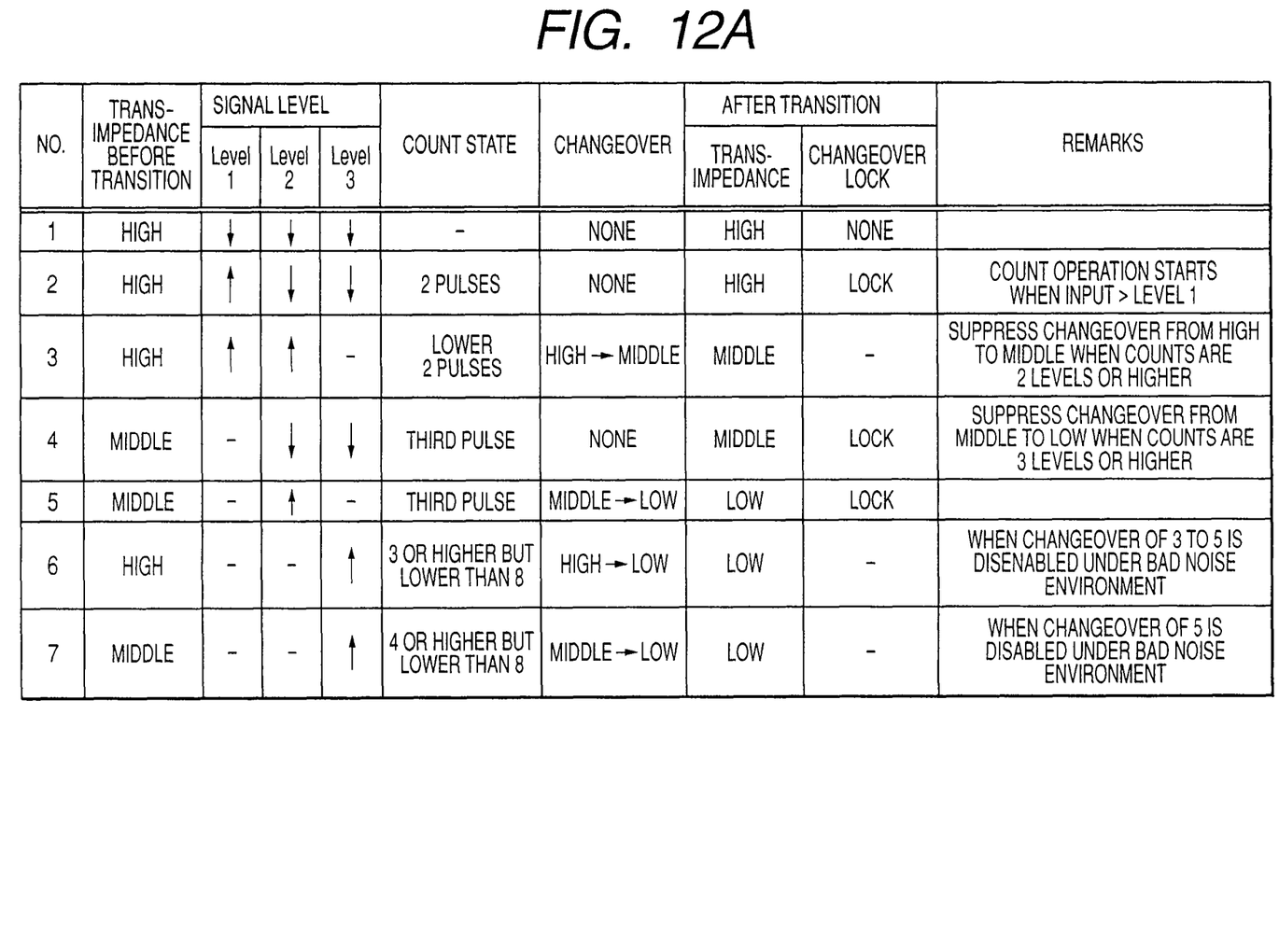
FIG. 12A is a diagram showing a changeover truth table in each of states.
Figure 12B:
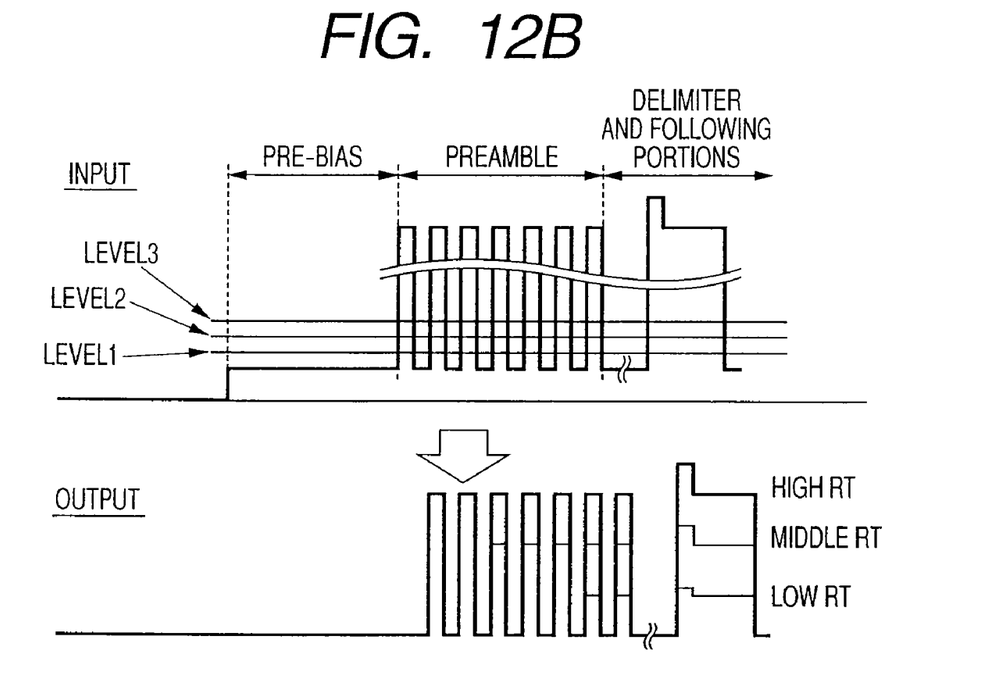
FIG. 12B is a waveform diagram showing the contents of the changeover truth table shown in FIG. 12A.

The control circuit 102 selects an optimum gain from the appropriate gains of high/middle/low according to the comparison threshold values 1, 2, and 3 and the timing information on the basis of a table shown in FIG. 12A. The details of the gain selection will be described below. FIG. 12B is a waveform diagram showing the contents of the changeover truth table of FIG. 12A.

(1) In the case where the signal level that has been converted into the voltage is smaller than all of the comparison threshold values 1, 2, and 3 when the state of the transimpedance is high, the counting operation of the counter 104 and the changeover operation of the transimpedance do not occur.

(2) In the case where the signal level that has been converted into the voltage is equal to or higher than the comparison threshold value 1 (i.e., Vdet as shown in FIG. 11 and LEVEL1 as shown in FIG. 10) and lower than the comparison threshold value 2 when the state of the transimpedance is high, the counter 104 conducts the counting operation, but the changeover operation of the transimpedance does not occur. Further, when two pulses are counted in this state, the changeover operation is suppressed so that the changeover operation does not occur, and the state of the transimpedance is locked to a high state because malfunction caused by the noise signal is prevented.

(3) In the case where the voltage converted signal level is equal to or higher than the comparison threshold value 2, and the count state of the counter 104 is lower than two pulses when the state of the transimpedance is high, the count state of the transimpedance is reduced to middle from high by one step.

(4) In the case where the signal level of a third pulse of the voltage converted signal is smaller than the comparison threshold value 2 when the state of the transimpedance is transited to middle from high, the changeover operation is suppressed, and the state of the transimpedance is locked to a middle state because malfunction caused by the noise signal is prevented.

(5) In the case where the signal level of the third pulse of the voltage converted signal is equal to or larger than the comparison threshold value 2 when the state of the transimpedance is transited to middle from high, the state of the transimpedance is further reduced to the low state from the middle state by one step.

As described above, since control is conducted on the basis of the comparison threshold values 1, 2, and 3, and the timing information, the setting of the comparison threshold values 1, 2, and 3 is also characteristic, which will be described in more detail below. Hereinafter, for simplification of description, when it is assumed that the feedback resistance=transimpedance value, and the feedback resistances are $R_H$, $R_M$, and $R_L$ from the higher gain side, the following relationship is essential in the comparison threshold values 1, 2, and 3 ($V_{DET}$, $V_{CH}$, $V_{FRC}$) in order to prevent malfunction when it is assumed that the noise or overshoot quantity is 20% of the main signal.

$$1.2 \times V_{DET} < V_{CH} \quad (1)$$

$$1.2 \times V_{CH} < V_{FRC} \quad (2)$$

Also, the minimum amplitude regulation must be kept.

FIG. 11 shows a level diagram. As shown in the level diagram, since the transimpedance is transited to the lower transimpedance at the output $V_{CH}$, when it is assumed that the minimum output regulation is $V_{MIN}$, and the maximum output regulation is $V_{MAX}$, the following expressions are satisfied.

$$V_{FRC} < V_{MAX} \quad (3)$$

$$V_{MIN} < V_{CH} * R_M/R_H \quad (4)$$

$$V_{MIN} < V_{CH} * R_L/R_M \quad (5)$$

The comparison threshold values 1, 2, and 3 that satisfy the above expressions (1) to (5) are set.

As described above, appropriate threshold values and appropriate counter control are set, thereby enabling the gain changeover at a high speed and with high precision to be realized.

Figure 9:
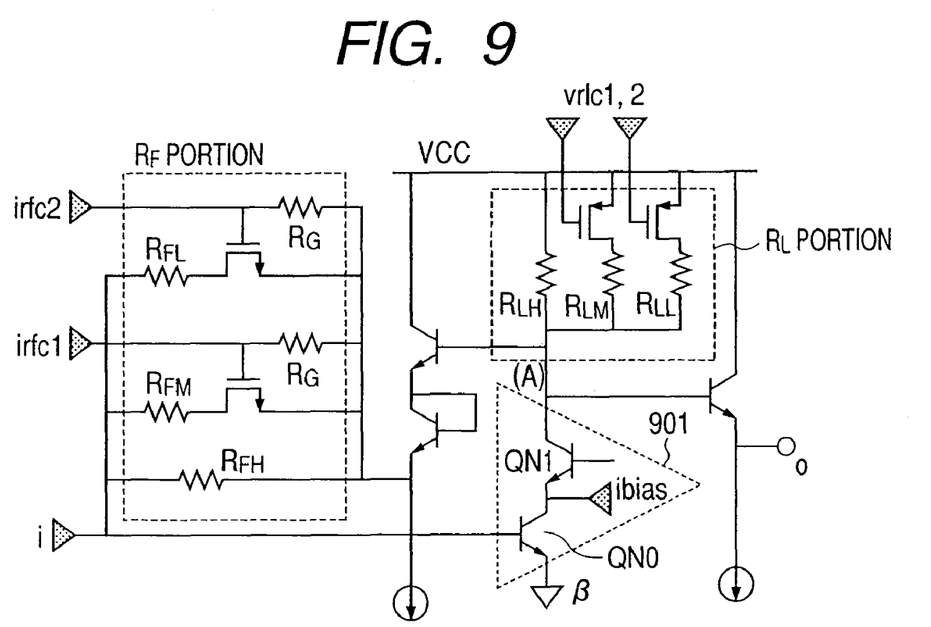
FIG. 9 is a circuit diagram showing an example of a transimpedance amplifier according to the present invention.

FIG. 9 shows one structural example of the TIA that constitutes the preamplifier 101 which is an example of the preamplifier according to the present invention. The TIA is configured in such a manner that the load resistor $R_L$ portion and the feedback resistor $R_F$ portion are connected to the amplifier 901. As compared with the conventional art shown in FIG. 8, a cascode transistor QN1 is connected to an upper stage of a main transistor QN0, and a current control terminal ibias is disposed at the collector terminal of the main transistor QN0 to constitute a pair of amplifiers 901, unlike the conventional art shown in FIG. 8.

When the transimpedance state is high, $R_F$ is larger. As a result, since the band is lowered as can be understood from Expression A, it is necessary to suppress the band from being lowered. Therefore, a current that flows in the main transistor is injected from the terminal ibias and increased, and the open loop gain is increased. As a result, the band of the circuit is increased without changing the circuit constant. On the other hand, when the transimpedance state is low, the stability of the circuit is reduced since the loop band is large, and the band is wide. Under the circumstances, the current that flows in the main transistor is drawn from the terminal ibias so that the loop gain is reduced, the band is lowered, and the phase margin is ensured, thereby enhancing the stability of the circuit. The current that flows in the main transistor is controlled in each of the transimpedance states thus switched over, and the countermeasure is conducted against the lowered band at the time of the high gain and the lowered phase margin at the time of the low gain.

As described above, according to this embodiment, the transimpedance is appropriately changed over within the short overhead of the GPON system, thereby making it possible to obtain a stable output waveform.

Second Embodiment

In the operations (1) to (5) of selecting the gain shown in the first embodiment, it is assumed that the count operation of the counter 104 occurs due to the input of the preamble signal portion as a precondition. Accordingly, in noisier environment, and the counter 104 conducts the miscount operation in the prebias portion, it is difficult to transit to the appropriate transimpedance.

Figure 13:
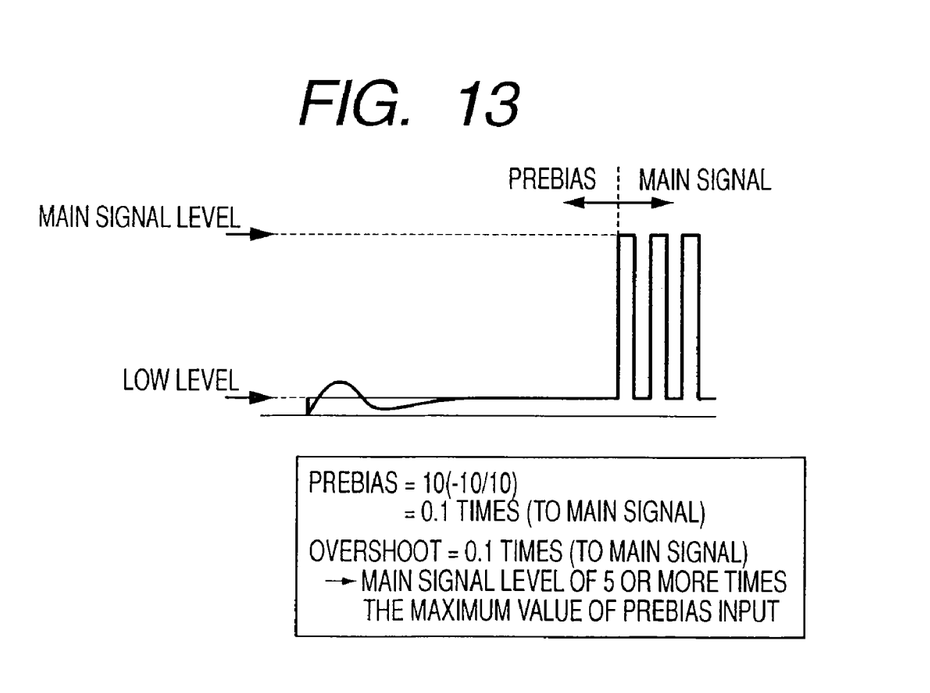
FIG. 13 is a diagram showing a waveform example when the noise environments are low.

For example, as shown in FIG. 13, it is difficult to transit to the appropriate transimpedance with respect to the waveform in noisier environment such that the low level of the prebias is about 0.1 times of the main signal level, the overshoot of the prebias is about 0.1 times of the main signal level, and the main signal level is five times or more of the maximum value of the prebias input.

Under the circumstances, more particularly, as a bailout effective in the case where the noise environment is low, the following operation (6) and (7) can be added after the above operation (1) to (5).

(6) When the state of the transimpedance is high, the number of count pulses of the counter 104 is equal to or higher than 3 but lower than 8, and the level of the signal that has been converted into the voltage is equal to or higher than the comparison threshold value 3, the state of the transimpedance is transited from high to low by two steps at a time.

(7) When the state of the transimpedance is middle, the number of count pulses of the counter 104 is equal to or higher than 4 but lower than 8, and the level of the signal that has been converted into the voltage is equal to or higher than the comparison threshold value 3, the state of the transimpedance is transited from middle to low.

Since the control is conducted on the basis of the comparison threshold values 1, 2, and 3, and the timing information, the setting of the comparison threshold values 1, 2, and 3 is characteristic, like the above first embodiment. However, the following points are different from the first embodiment.

In the level diagram shown in FIG. 11, that the noise environment is low, and the prebias portion conducts the miscount means that the extinction ratio and the noise input exceed the comparison threshold value 1 (i.e., Vdet as shown in FIG. 11 and LEVEL1 as shown in FIG. 10), the counter 104 transits to the operation enable state, and the miscount is conducted by the waveform of the signal that is transmitted from the main amplifier 107 to the preamble recovery 105 due to the waveform fluctuation caused by the noise input. The high frequency noises and the low frequency noises can be removed by some degree by the BPF of the preamble recovery 105. However, the noises of the signal band cannot be removed.

Under the above circumstances, when the signal level exceeds the comparison signal 1 in the prebias portion provided that the removal of the noises is disenabled, even if the transimpedance transits to the lowest transimpedance, the transimpedance is so set as not to violate the minimum output voltage regulation.

Taking that the extinction ratio specification 10 dB of the GPON is the signal level of about 10% of the main signal at the low level into consideration, when the overshoot of the prebias portion and the noises are about 10% of the main signal, the prebias portion main signal level of the comparison signal 1 is represented by the following expression.

$$I = V_{DET}/R_H * 5$$

Since the voltage that operates the optical current by the low gain ($R_L$) needs to be larger than the minimum output regulation ($V_{MIN}$), the following expression is satisfied.

$$V_{MIN} < V_{DET} * R_L / R_H * 5 \tag{6}$$

The comparison threshold values 1, 2, and 3 are set which satisfy the expressions (1) to (6) obtained by adding the above expression (6) to the expressions (1) to (5) of the first embodiment.

As described above, according to this embodiment, in particular, even in noisier environment, the transimpedance is appropriately changed over within the shorter overhead of the GPON system, thereby making it possible to obtain the stable output waveform.

What is claimed is:

1. A preamplifier, comprising:
   an input port that inputs a current signal according to the intensity of an optical signal;
   a first amplifier that converts the current signal that is input from the input port into a voltage signal;
   a second amplifier that inputs the voltage signal that is output from the first amplifier and amplifies the voltage signal;
   an output port that outputs the voltage signal that is output from the second amplifier; and
   a counter that counts the number of voltage signals and outputs a counted result,
   wherein the gain of the first amplifier is changed over on the basis of the count value that is output from the counter,
   wherein the first amplifier includes a main transistor, a cascode transistor that is connected to an upper stage of the main transistor, and a bias terminal that is disposed at a connection point between the main transistor and the cascode transistor, and
   wherein a current injection into the main transistor and a current drawing from the main transistor are controlled through the bias terminal.

2. The preamplifier according to claim 1, further comprising a level detector that detects the level of the voltage signal and outputs the detected level to the counter,
   wherein the counter starts the operation on the basis of the level of the voltage signal that is detected by the level detector.

3. The preamplifier according to claim 2,
   wherein the gain of the first amplifier is changed over on the basis of the level that is output by the level detector and the count value that is output by the counter.

4. The preamplifier according to claim 3, further comprising a preamble recovery that inputs the voltage signal and outputs a significant voltage signal to the counter,
   wherein the counter counts the number of significant voltage signals.

5. The preamplifier according to claim 4,
   wherein the reference level of the operation start of the counter is determined on the basis of a permissible extinction ratio of the voltage signal corresponding to the optical signal and a noise level of a voltage signal corresponding to the optical signal.

6. An optical receiving apparatus, comprising:
   an optical input port;
   an avalanche photodiode having one terminal connected to a reference potential;
   a preamplifier having an input port connected to another terminal of the avalanche photodiode, which inputs a current signal corresponding to an optical signal that is input to the avalanche photodiode, subjects the current signal to current/voltage conversion, and outputs a signal that has been converted into the voltage;
   a postamplifier having an input port connected to the output port of the preamplifier, which inputs the voltage signal that is output from the preamplifier, subjects the voltage signal to waveform shaping, and outputs the voltage signal that has been subjected to the waveform shaping; and
   a waveform shaping voltage signal output port that is externally connected to a signal processing circuit which processes the waveform shaped voltage signal and internally connected to an output port of the postamplifier,
   wherein the preamplifier includes:
   a current signal input port that inputs the current signal corresponding to the optical signal;
   a first amplifier that converts the current signal that is input from the current signal input port into a voltage signal;
   a second amplifier that inputs the voltage signal that is output from the first amplifier and amplifies the voltage signal;
   a voltage signal output port that outputs the voltage signal that is output from the second amplifier; and
   a counter that counts the number of voltage signals and outputs a counted result,
   wherein the gain of the first amplifier is changed over on the basis of the count value that is output from the counter,
   wherein first amplifier includes a main transistor, a cascode transistor that is connected to an upper stage of the main transistor, and a bias terminal that is disposed at a connection point of the main transistor and the cascode transistor, and wherein the current injection into the main transistor and the current drawing from the main transistor are controlled through the bias terminal.

7. The optical receiving apparatus according to claim 6, further comprising a level detector that detects the level of the voltage signal and outputs the detected level to the counter,
wherein the counter starts the operation on the basis of the level of the voltage signal that is detected by the level detector.

8. The optical receiving apparatus according to claim 7,
wherein the gain of the first amplifier is changed over on the basis of the level that is output by the level detector and the count value that is output by the counter.

9. The optical receiving apparatus according to claim 8, further comprising a preamble recovery that inputs the voltage signal and outputs a significant voltage signal to the counter,
wherein the counter counts the number of significant voltage signals.

10. The optical receiving apparatus according to claim 9,
wherein the reference level of the operation start of the counter is determined on the basis of a permissible extinction ratio of the voltage signal corresponding to the optical signal and a noise level of a voltage signal corresponding to the optical signal.

* * * * *